United States Patent [19]

Kawahara

[11] Patent Number: 5,959,901
[45] Date of Patent: *Sep. 28, 1999

[54] STATIC SEMICONDUCTOR MEMORY OF FLIP-FLOP CIRCUIT TYPE WITH DRIVING N-CHANNEL TRANSISTORS

[75] Inventor: Hiroyasu Kawahara, Kanagawa, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/732,147

[22] Filed: Oct. 16, 1996

[30] Foreign Application Priority Data

Oct. 16, 1995 [JP] Japan .................................. 7-266922

[51] Int. Cl.$^6$ ........................................................ G11C 7/00
[52] U.S. Cl. ................. 365/189.11; 365/175; 365/190; 365/205
[58] Field of Search ........................... 365/189.11, 190, 365/205, 207, 175, 72

[56] References Cited

U.S. PATENT DOCUMENTS

| | | | |
|---|---|---|---|
| 4,866,674 | 9/1989 | Tran | 365/190 X |
| 5,229,967 | 7/1993 | Nogle et al. | 365/189.09 X |
| 5,475,639 | 12/1995 | Iwase et al. | 365/189.11 |
| 5,574,687 | 11/1996 | Nakase | 365/189.11 X |

FOREIGN PATENT DOCUMENTS

| | | |
|---|---|---|
| 63-9095 | 1/1988 | Japan . |
| 4-102294 | 4/1992 | Japan . |

*Primary Examiner*—Do Hyun Yoo
*Attorney, Agent, or Firm*—Whitham, Curtis & Whitham

[57] ABSTRACT

In a semiconductor memory including first and second bit lines complementary to each other and provided for each one memory cell column, and a sense amplifier connected to the first and second bit lines, for sensing and amplifying a voltage difference between the first and second bit lines, a first pull-up circuit is connected to the first bit line, for pulling up, in accordance with a potential of the second bit line, the first bit line to a high voltage supply potential. A second pull-up circuit is connected to the second bit line, for pulling up, in accordance with a potential of the second bit line, the second bit line to a high level potential lower than that the high voltage supply potential by a predetermined potential difference.

16 Claims, 7 Drawing Sheets

STATIC SEMICONDUCTOR MEMORY OF FLIP-FLOP CIRCUIT TYPE WITH DRIVING N-CHANNEL TRANSISTORS

BACKGROUND OF THE INVENTION

1. Field of the Invention

The present invention relates to a semiconductor memory, and more specifically to a static semiconductor memory which includes flip-flop circuit type memory cells with driving n-channel transistors and which is suitable to be incorporated into an application-specific integrated circuit.

2. Description of Related Art

Referring to FIG. 1, there is a partial circuit diagram of a conventional static semiconductor integrated circuit memory composed of flip-flop circuit type memory cells with driving n-channel transistors and arranged in the form of a matrix (first prior art example).

The shown conventional static semiconductor integrated circuit memory includes a number of memory cell columns, but only one memory cell column is shown for simplification of drawing since the memory cell columns have the same construction. The shown memory cell column includes a number of memory cells $MC_1$ to $MC_m$, but only two memory cells $MC_1$ and $MC_m$ are shown for simplification of drawing since the memory cells have the same construction.

Each memory cell includes a pair of source-grounded driving n-channel MOSFET (met-al-oxide-semiconductor field effect transistor) transistors $Q_1$ and $Q_2$ each having a gate connected to a drain of the other driving transistor, and another pair of p-channel MOSFET transistors $Q_3$ and $Q_4$ having their source connected to a high voltage supply potential Vcc, their drain connected to the drain of the transistors $Q_1$ and $Q_2$, respectively, and their gate connected to the gate of the transistors $Q_1$ and $Q_2$, respectively. With this interconnection, CMOS (complementary MOS) flip-flop circuits are formed with each of the p-channel MOS transistors $Q_3$ and $Q_4$ as a load.

The memory cell further includes a switching n-channel transistor $Q_5$ having a source and a drain, one of which is connected to the drains of the transistors $Q_1$ and $Q_3$, and another switching n-channel transistor $Q_6$ having a source and a drain, one of which is connected to the drains of the transistors $Q_2$ and $Q_4$.

The shown conventional static semiconductor integrated circuit memory further includes a plurality of word lines $WL_1$ to $WL_m$ provided for the memory cells included in each memory cell column, respectively, one for one. In addition, one pair of bit lines $BL_1$ and $BL_2$ is provided for each one of the memory cell columns, for transferring a pair of complementary binary data. Each of the word lines $WL_1$ to $WL_m$ is connected to a gate of the switching transistors $Q_5$ and $Q_6$ of a corresponding memory cell of each memory cell column. One of the pair of bit lines $BL_1$ is connected to the other of the source and the drain of the switching transistor $Q_5$ of all the memory cells included in the corresponding memory cell column, and the other of the pair of bit lines $BL_2$ is connected to the other of f source and the drain of the switching transistor $Q_6$ of all the memory cells included in the same corresponding memory cell column. With this arrangement, if one of the word lines $WL_1$ to $WL_m$ is activated to a selection level, the switching transistors $Q_5$ and $Q_6$ of the memory cell connected to the word line activated to the selection level are turned on, namely, the memory cell connected to the word line activated to the selection level is selected, so that a complementary data can be written through the pair of complementary bit lines $BL_1$ and $BL_2$ into the flip-flop circuit of the selected memory cell, or can be read out from the flip-flop circuit of the selected memory cell through the pair of complementary bit lines $BL_1$ and $BL_2$.

Furthermore, the shown conventional static semiconductor integrated circuit memory includes a sense amplifier 1 having a first two-input NAND gate $G_1$ having a first input connected to the bit line $BL_1$, and a second two-input NAND gate $G_2$ having a first input connected to the bit line $BL_2$, a second input connected to an output of the first NAND gate $G_1$ and an output connected to a second input of the first NAND gate $G_1$, so that a flip-flop circuit is formed of the two NAND gates $G_1$ and $G_2$. An inverter $IV_1$ is also provided, which has an input connected to the output of the NAND gate $G_1$ and an output connected to an output terminal DO. With this arrangement, the sense amplifier 1 is formed to sense and amplify a voltage difference between the pair of complementary bit lines $BL_1$ and $BL_2$.

In the above mentioned conventional semiconductor memory, when data is read from the selected memory cell, since the bit lines $BL_1$ and $BL_2$ are connected to a number of memory cells $MC_1$ to $MC_m$ and itself have a long wiring length, each of the bit lines $BL_1$ and $BL_2$ constitutes a large load, so that a level transition time of the bit lines $BL_1$ and $BL_2$ becomes long. In addition, generally, since a p-channel MOS transistor has a current drive capacity smaller than that of an n-channel MOS transistor because of difference in conductivity type of the impurity-diffused layers, the bit lines $BL_1$ and $BL_2$ relatively quickly transit in from a high level to a low level by action of the driving n-channel MOS transistors $Q_1$ and $Q_2$, but the bit lines $BL_1$ and $BL_2$ relatively remarkably slowly transit in from the low level to the high level by action of the load p-channel MOS transistors $Q_3$ and $Q_4$. This problem will similarly occur even if the load circuit of the memory cells $MC_1$ to $MC_m$ is constituted of resistors in place of the p-channel MOS transistors $Q_3$ and $Q_4$.

In order to overcome this problem, for example, Japanese Patent Application Laid-open Publication Nos. JP-A-63-009095 and JP-A-4-102294 proposed an improved semiconductor memory in which each bit line is precharged to an intermediate level between a high level and a low level. In this approach, a reading operation can be started until a precharge operation is completed, and therefore, this precharge operation period becomes a hindrance in improving the operation speed.

In the meanwhile, in a semiconductor memory used in an application specific integrated circuit (abbreviated to an "ASIC"), it is conventional practice to connect a pull-up circuit to each of the bit lines in order to quicken the potential elevation of the bit line.

Referring to FIG. 2, there is a partial circuit diagram of a second example of the conventional static semiconductor integrated circuit memory having the pull-up circuit (second prior art example). In FIG. 2, elements similar to those shown in FIG. 1 are given the same Reference Numerals and explanation thereof will be omitted for simplification of description. As seen from comparison between FIGS. 1 and 2, the second prior art example is featured by pull-up circuits 2 and 2X additionally connected to the bit lines $BL_1$ and $BL_2$, respectively, in the first prior art example shown in FIG. 1.

The pull-up circuit 2 includes a p-channel transistor $Q_{21}$ having a source connected to the high voltage supply potential Vcc, a drain connected to the bit line $BL_1$, and a gate connected to the bit line BL2. The pull-up circuit 2X includes a p-channel transistor Q22 having a source connected to the high voltage supply potential Vcc, a drain connected to the bit line BL2, and a gate connected to the bit line BL1.

Operation of this semiconductor memory of the second prior art example will be described with a waveform diagram of FIG. 3.

When the bit line BL1 changes from a low level to a high level, the bit line BL2 changes from the high level to the low level. In this process, when the potential of the bit line BL2 becomes lower than a threshold Vta of the transistor Q21 of the pull-up circuit 2, the transistor Q21 is turned on, so that the high voltage supply potential Vcc is supplied through the turned-on transistor Q21 to the bit line BL1. As a result, the time required for the bit line BL1 to reach the high level (high voltage supply potential Vcc) is shortened. In FIG. 3, the dotted line shows the first prior art example which does not have the pull-up circuit 2.

On the other hand, the transistor Q22 of the pull-up circuit 2X is in an on condition at an initial stage of the above mentioned level transiting process, but since the transistor Q2 of the memory cells MC1 to MCm has the current drive capacity far larger than that of the transistor Q22, influence of the on condition of the transistor Q22 is very small.

In this second prior art example, for example, a specific data reading time was 2.9 ns for a low level data and 4.2 ns for a high level data.

Therefore, the difference between the high level data reading time and the low level data treading time was greatly improved in the second prior art example, however, the high level data reading time is still longer than the low level data reading time at an non-negligible degree, with the result that the overall reading speed is still low.

In order to overcome this problem, it may be considered to lower a pull-up potential, but to the contrary, adverse influences such as noises occur to the sense amplifier.

SUMMARY OF THE INVENTION

Accordingly, it is an object of the present invention to provide a semiconductor memory which has overcome the above mentioned defects of the conventional ones.

Another object of the present invention is to provide a static semiconductor memory capable of minimizing the time difference between the high level data reading time and the low level data reading time, with giving no adverse influence such as noises to the sense amplifier, whereby the overall reading speed can be made elevated.

The above and other objects of die present invention are achieved in accordance with the present invention by a semiconductor memory comprising:

at least one memory cell column including a plurality of memory cells of the flip-flop type having driving n-channel transistors;

a plurality of word lines each provided for a corresponding one memory cell of the plurality of memory cells included in the at least one memory cell column, for putting the corresponding one memory cell in a selected condition when the corresponding one memory cell is to be selected;

first and second bit lines complementary to each other and provided for the at least one memory cell column;

a sense amplifier connected to the first and second bit lines, for sensing and amplifying a voltage difference between the first and second bit lines;

a first pull-up circuit connected to the first bit line, for pulling up a potential of the first bit line to a first high level potential in accordance with a potential of the second bit line; and a second pull-up circuit connected to the second bit line, for pulling up, in accordance with a potential of the second bit line, a potential of the second bit line to a second high level potential lower than that the first high level potential by a predetermined potential difference.

In one embodiment of the semiconductor memory in accordance with the present invention, the first pull-up circuit includes a first p-channel transistor having a source connected to a high voltage supply potential, a drain connected to the first bit line, and a gate connected to the second bit line, and the second pull-up circuit includes a second p-channel transistor having a drain connected to the second bit line, and a gate connected to the first bit line, and a voltage dropping means having one end connected to a source of the second p-channel transistor and the other end connected to the high voltage supply potential, for supplying the source of the second p-channel transistor with a voltage which is lower than the high voltage supply potential by the predetermined potential difference.

The voltage dropping means is formed of a diode means, which can be formed of one selected from the group consisting of a diode having an anode connected to the high voltage supply potential and a cathode connected to the source of the second p-channel transistor, a bipolar transistor connected between the source of the second p-channel transistor and the high voltage supply potential, and having a collector and a base connected to each other, and a field effect transistor connected between the source of the second p-channel transistor and the high voltage supply potential, and having a drain and a gate connected to each other.

Preferably, the sense amplifier includes an output circuit for changing the level of the output signal outputted from the output circuit, on the basis of a level change of a pair of complementary data from the first and second bit lines, the output circuit being configured to determine, on the basis of a high level data of the first bit line, a final level when one of a high level and a low level outputted from the output circuit transits to the other of the high level and the low level. The output circuit of the sense amplifier can be constituted of a first two-input NAND gate having a first input connected to the first bit line, and a second two-input NAND gate having a first input connected to the second bit line, a second input connected to an output of the first two-input NAND gate, and an output connected to a second input of the first two-input NAND gate, an output of the first two-input NAND gate constituting an output of the output circuit.

The above and other objects, features and advantages of the present invention will be apparent from the following description of preferred embodiments of the invention with reference to the accompanying drawings.

DESCRIPTION OF THE PREFERRED EMBODIMENTS

Figure 1:
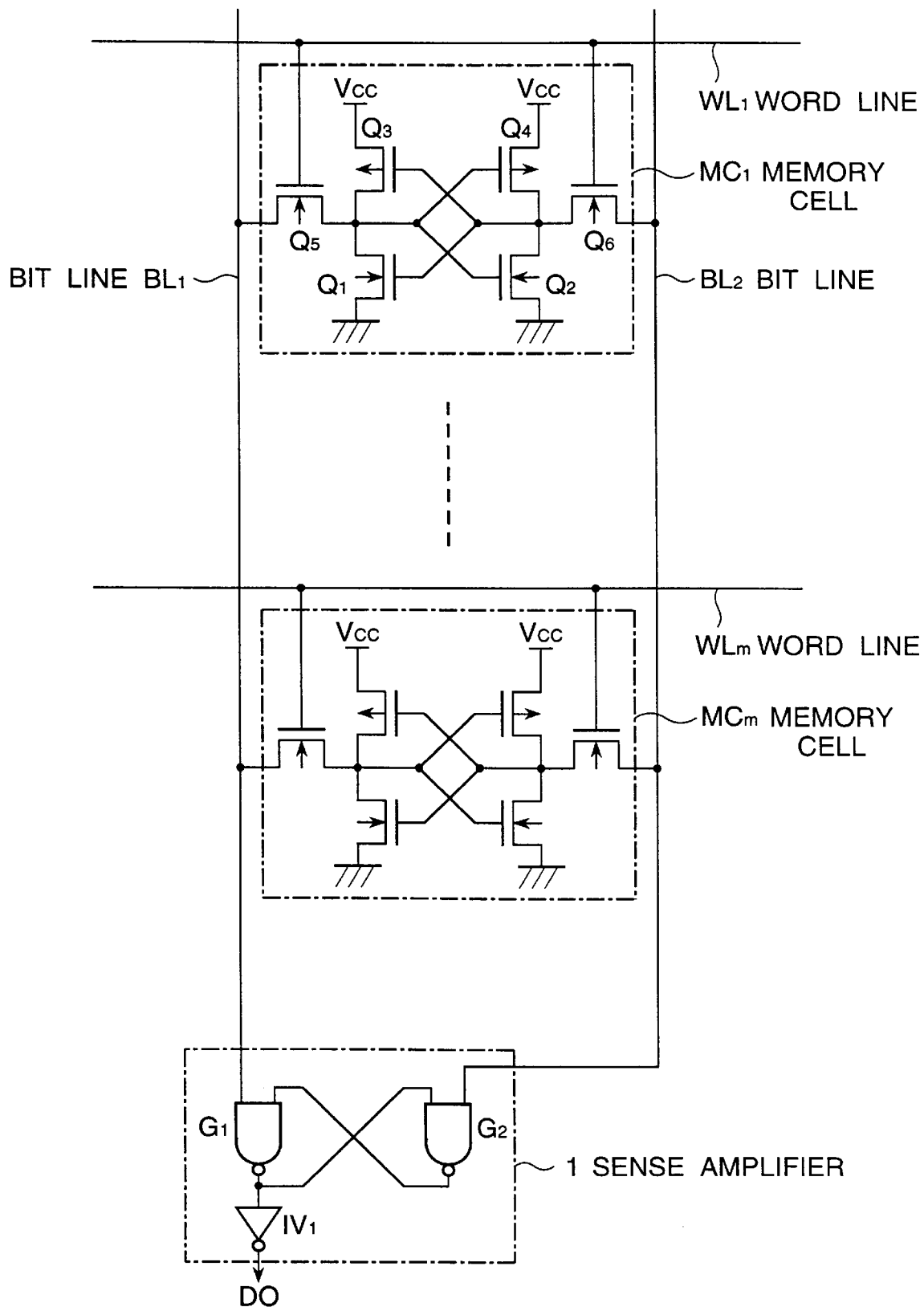
FIG. 1 is a partial circuit diagram of a first prior art example of the static semiconductor integrated circuit memory composed of flip-flop circuit type memory cells with driving n-channel transistors.
Figure 4:
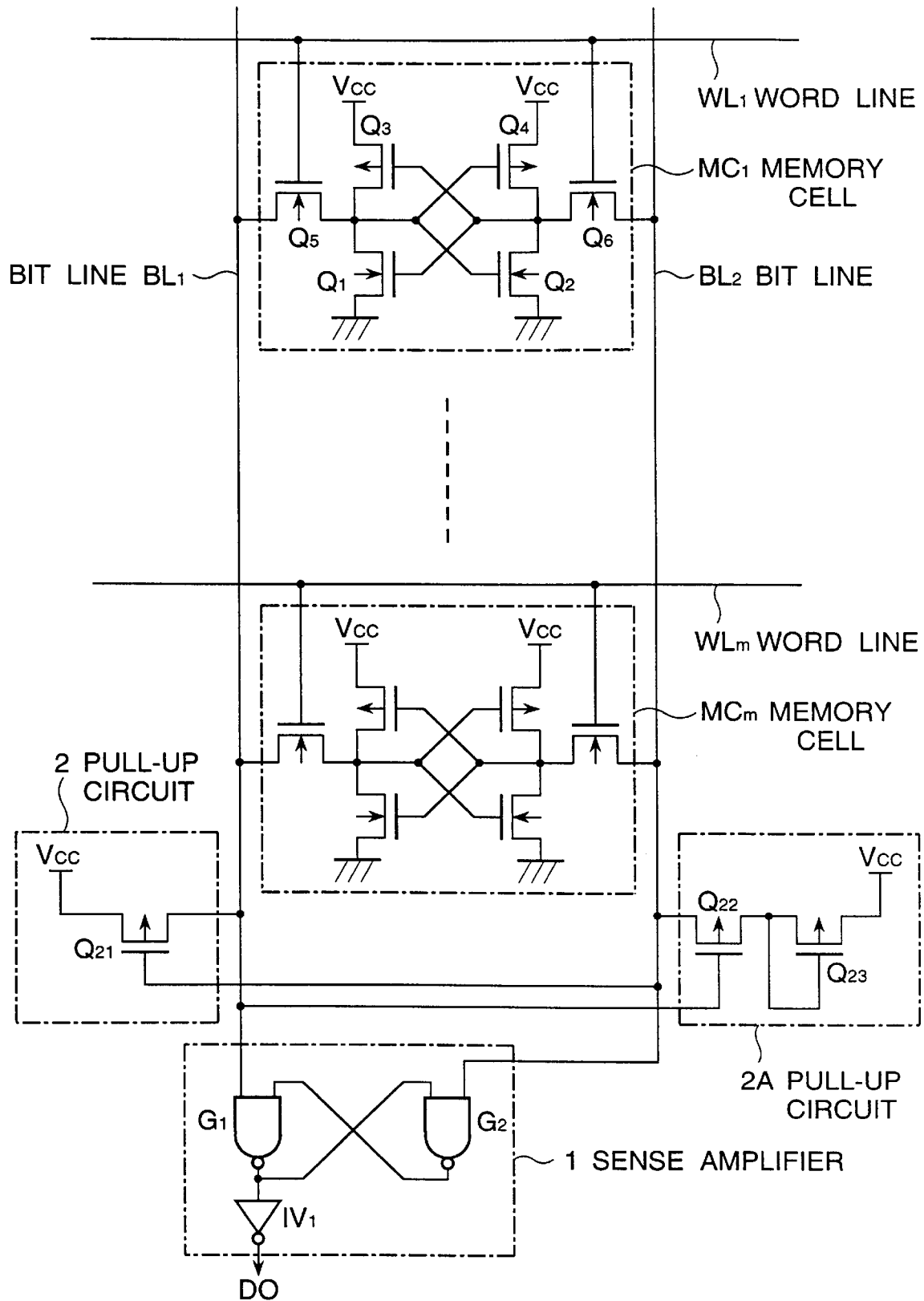
FIG. 4 is a partial circuit diagram of an embodiment of the static semiconductor integrated circuit memory in accordance with the present invention.

Referring to FIG. 4, there is shown a partial circuit diagram of an embodiment of the static semiconductor integrated circuit memory in accordance with tie present invention. In FIG. 4, elements similar to those shown in FIGS. 1 and 2 are given the same Reference Numerals, and explanation thereof will be omitted for simplification of description.

Figure 2:
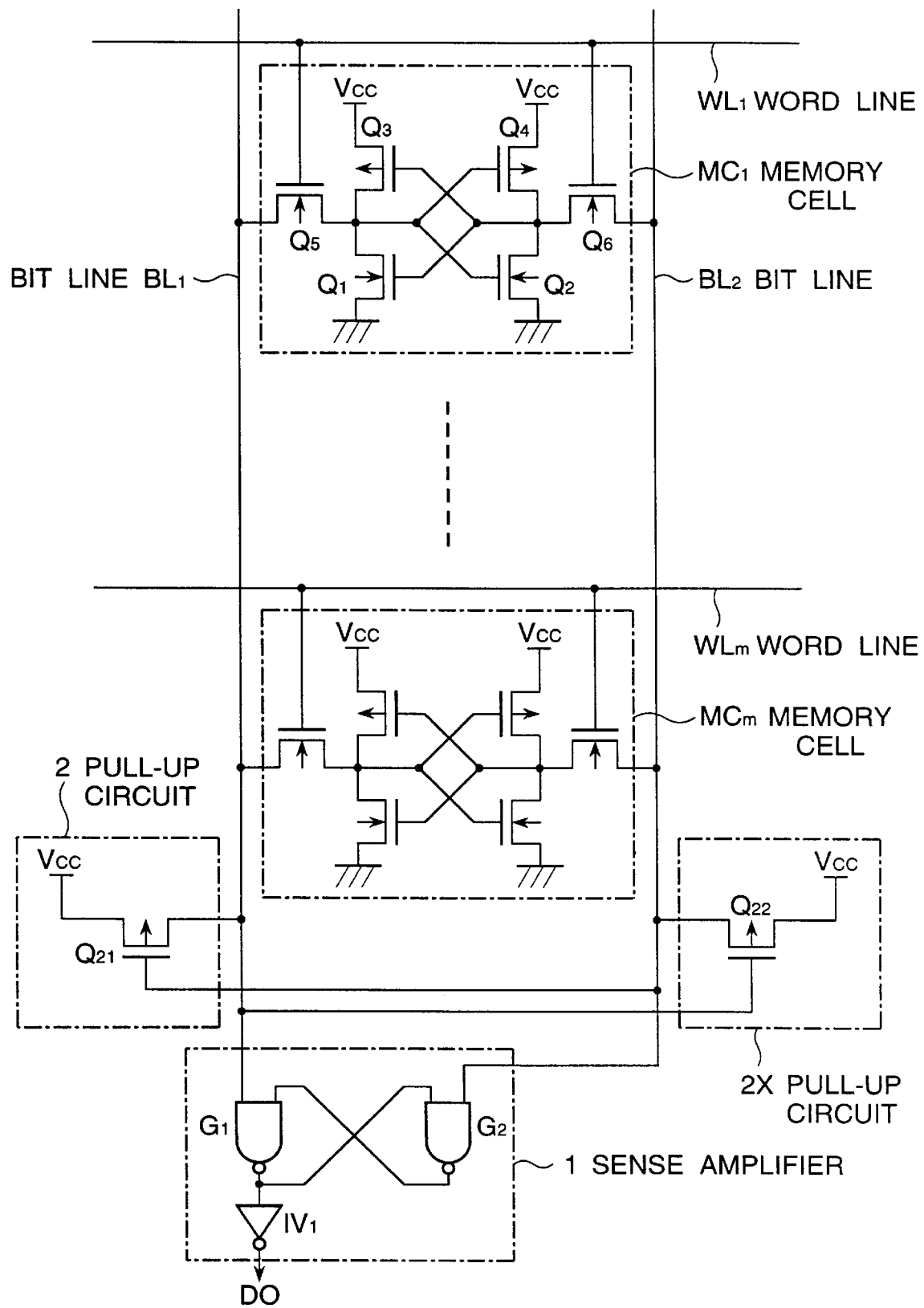
FIG. 2 is a partial circuit diagram of a second prior art example of the static semiconductor integrated circuit memory composed of flip-flop circuit type memory cells with driving n-channel transistors.
Figure 3:
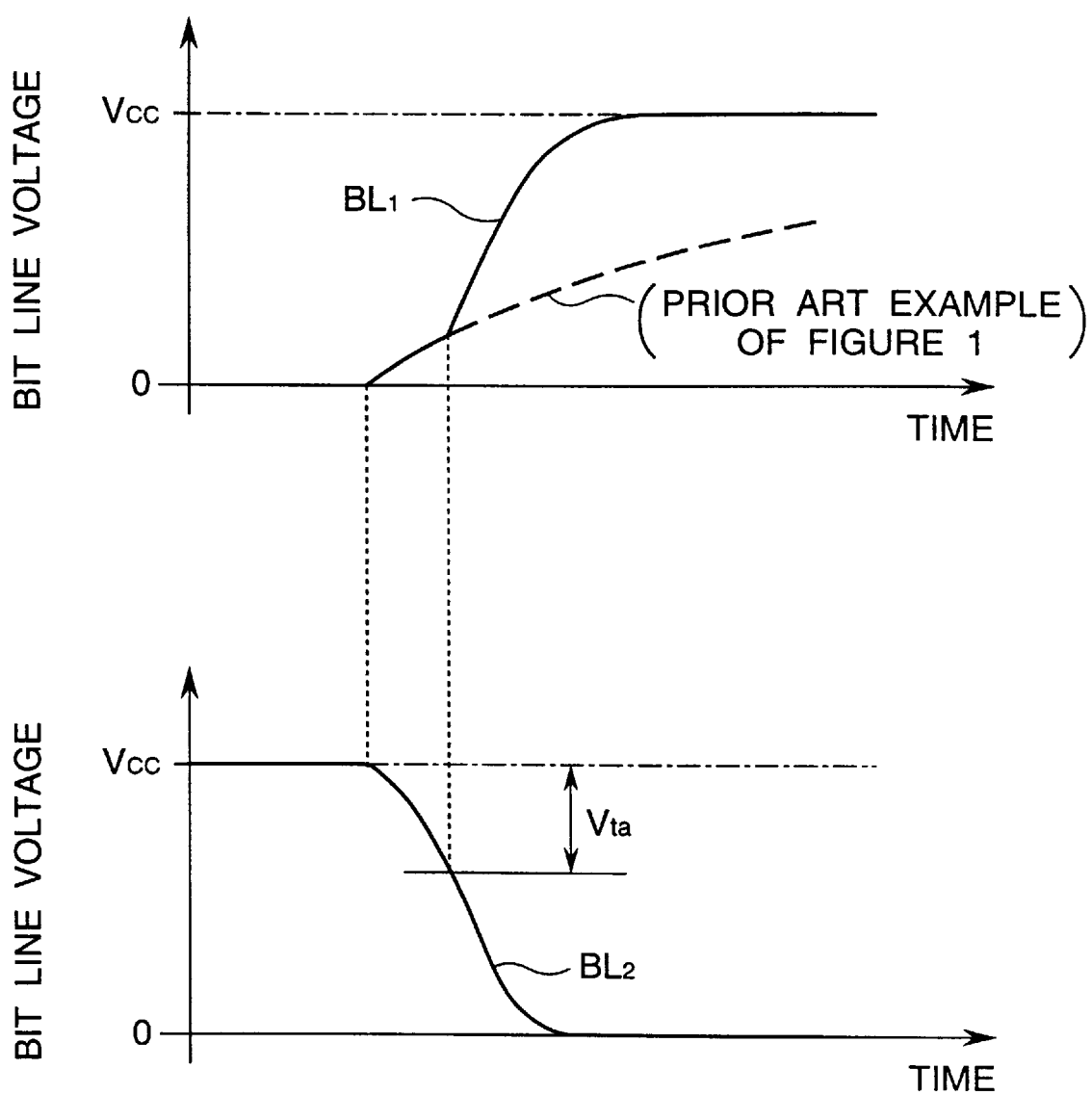
FIG. 3 illustrate a voltage change of the pair of bit lines in the semiconductor memory shown in FIG. 2.

As seen from comparison between FIGS. 2 and 4, the embodiment shown in FIG. 4 is featured in that the pull-up circuit 2X shown in FIG. 2 is replaced with another pull-up circuit 2A, which includes a p-channel transistor Q22 having a drain connected to the bit line BL2 and a gate connected to the bit line BL1, and another p-channel transistor Q23 having a drain and a gate connected to a source of the transistor Q22 and a source connected to the high voltage supply potential Vcc. This p-channel transistor Q23 constitutes a diode in function, and applies a voltage lower than the high voltage supply potential Vcc by a threshold Vtb of the transistor Q23, to the source of the transistor Q22. Thus, the pull-up circuit 2A functions to pull up, in accordance with the potential of the bit line BL1, the bit line BL2 to a high level potential lower than the high voltage supply potential Vcc by the threshold Vtb of the transistor Q23.

Operation of this semiconductor memory will be described with a waveform diagram of FIG. 5.

Figure 5:
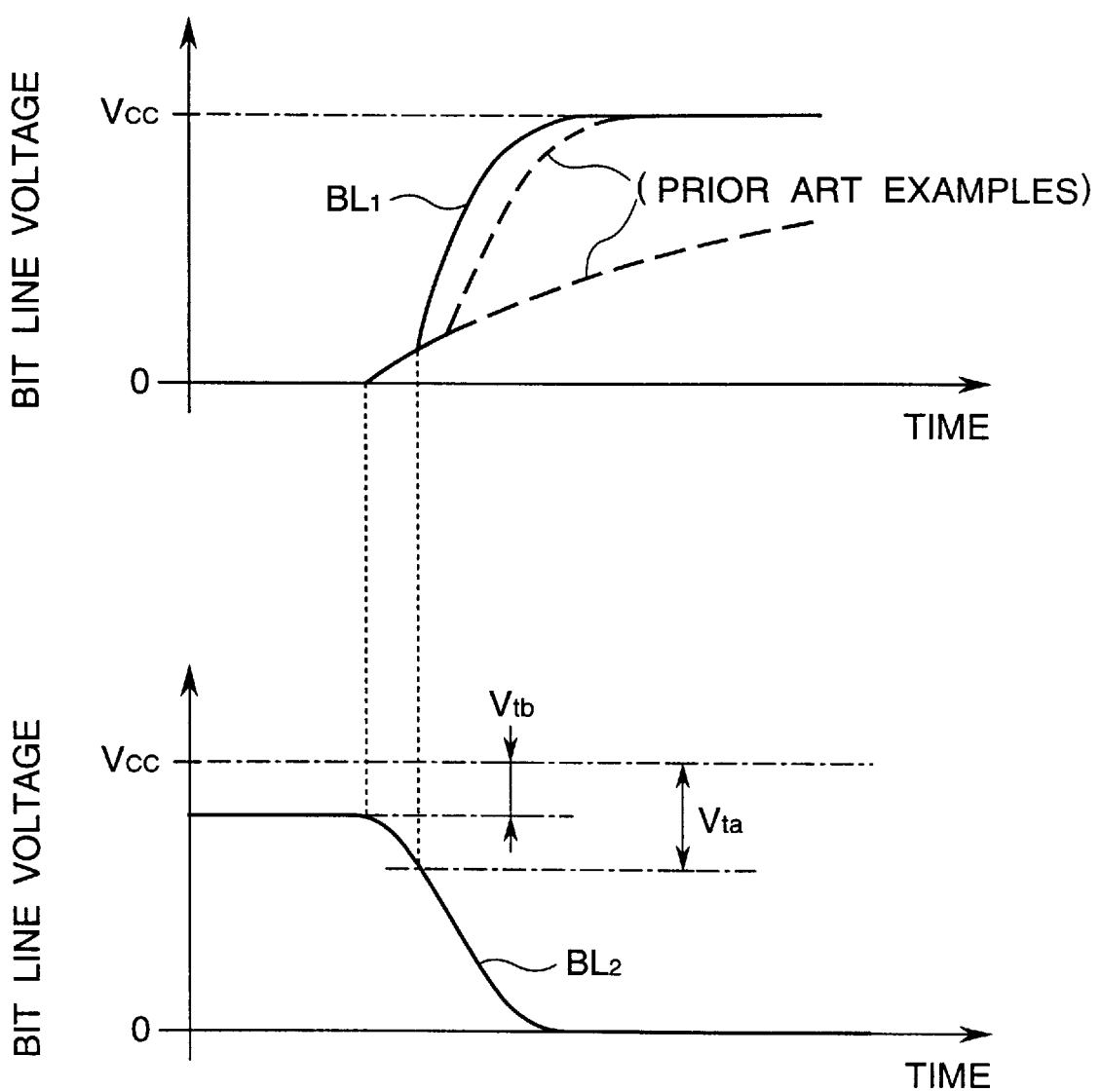
FIG. 5 illustrate a voltage change of the pair of bit lines in the semiconductor memory in FIG. 4.

When data stored in a selected memory cell (for example, MC1) is read out so that the bit line BL1 changes from a low level to a high level, the bit line BL2 changes from the high level to the low level, as shown in FIG. 5. At this time, when the potential of the bit line BL2 becomes lower than a threshold Vta of the transistor Q21 of the pull-up circuit 2, the transistor Q21 is turned on, so that the high voltage supply potential Vcc is supplied through the turned-on transistor Q21 to the bit line BL1. As a result, the time required for the bit line BL1 to reach the high level (high voltage supply potential Vcc) is shortened.

In this process En which the bit line BL1 changes from the low level to the high level, the potential of the bit line BL2 supplied to the gate of the transistor Q21 in the pull-up circuit 2, is already pulled, by an operation before this reading operation is started, to the high level potential lower than the high voltage supply potential Vcc by the threshold Vtb of the transistor Q23 by action of the voltage dropping transistor Q23 in the pull-up transistor 2A (namely, Vcc−Vtb), as shown in FIG. 5. Therefore, when the reading operation is started, the potential of the bit line BL2 starts to lower from the above mentioned lowered high level potential toward the low level, and therefore, the time required for the potential of the bit line BL2 to become lower than the threshold Vta of the transistor Q21 is shortened in comparison with the second prior art example shown in FIG. 2 in which the potential of the bit line BL2 starts to lower from the high voltage supply potential Vcc. Namely, the time until the transistor Q21 is turned on, can be shortened, and therefore, the time required for pulling up the bit line BL1 to the high voltage supply potential Vcc can be shortened, as shown by the solid line in FIG. 5 in which the dotted lines illustrate the first and second prior art examples shown in FIGS. 1 and 2.

Specifically, the low level reading time was 2.9 ns, but the high level reading time could be reduced to 3.7 ns. Namely, a time difference between the low level reading time and the high level reading time could be shortened.

Now, attention is directed to a level transition of the sense amplifier 1 when the bit line BL1 changes from the low level to the high level and the bit line BL2 changes from the high level to the low level. First, in response to the change of the bit line BL2 to the low level, the output of the NAND gate G2 is brought to the high level, and thereafter, in response to the change of the bit line BL1 to the high level, the output of the NAND gate G1 is brought to the low level. Thus, the condition becomes a final condition of the level transition. The low level of the output of the NAND gate G1 is inverted by the inverter IV1, which outputs a high level signal.

Next, attention is directed to a level transition of the sense amplifier 1 when the bit line BL1 changes from the high level to the low level and the bit line BL2 changes from the low level to the high level. First, in response to the change of the bit line BL1 to the low level, the output of the NAND gate G1 is brought to the high level, which is in turn inverted by the inverter IV1, which outputs a low level signal. At this time, however, the condition has not reached a final condition of the level transition. Thereafter, in response to the change of the bit line BL2 to the high level, the output of the NAND gate G2 is brought to the low level. Thus, the condition becomes a final condition of the level transition.

As mentioned above, in the shown sense amplifier 1, the final condition of the output level transition to the high level is determined by the transition of the bit line BL1 to the high level, and the level of the data of this final condition is outputted from the sense amplifier 1. On the other hand, the transition of the bit line BL1 to the low level immediately appears as the level change of the output data, but at this time, the level transition in the inside of the sense amplifier has not become the final condition. Therefore, it can be said that, the quick transition of the bit line BL1 to the high level results in a quickened reading operation, but the quick transition of the bit line BL2 to the high level does not give a substantial influence on the speed-up of the reading operation. Accordingly, it is not necessary to pull up the bit line BL1 to a high level potential lower than the high voltage supply potential Vcc (Vcc−Vtb). In other words, since it is possible to maintain, at the high voltage supply potential Vcc, the high level potential of the bit line BL1 which determines the level of the output level, the data supplied to the input of the sense amplifier 1 has a large margin to noises. It is possible to prevent an adverse influence of the noises and others to the sense amplifier.

In the above mentioned embodiment, the sense amplifier 1 has been composed to include the flip-flop composed of the NAND gates G1 and G2, but can be composed of a conventional amplifier having no flip-flop circuit, for example, a pair of cascaded inverters connected to the bit line BL1. In this modification, the level of the bit line BL1 is outputted as it is, but the quickened reading operation and the anti-noise property can be obtained similarly to the above mentioned embodiment.

Referring to FIGS. 6 to 9, there are shown partial circuit diagrams of various modifications of the embodiment of the semiconductor memory shown in FIG. 4. In these figures, only one memory cell MCm is shown in the form of a block for simplification of the drawing, since the portion excluding the pull-up circuits is the same as that of the semiconductor memory shown in FIG. 4.

Figure 6:
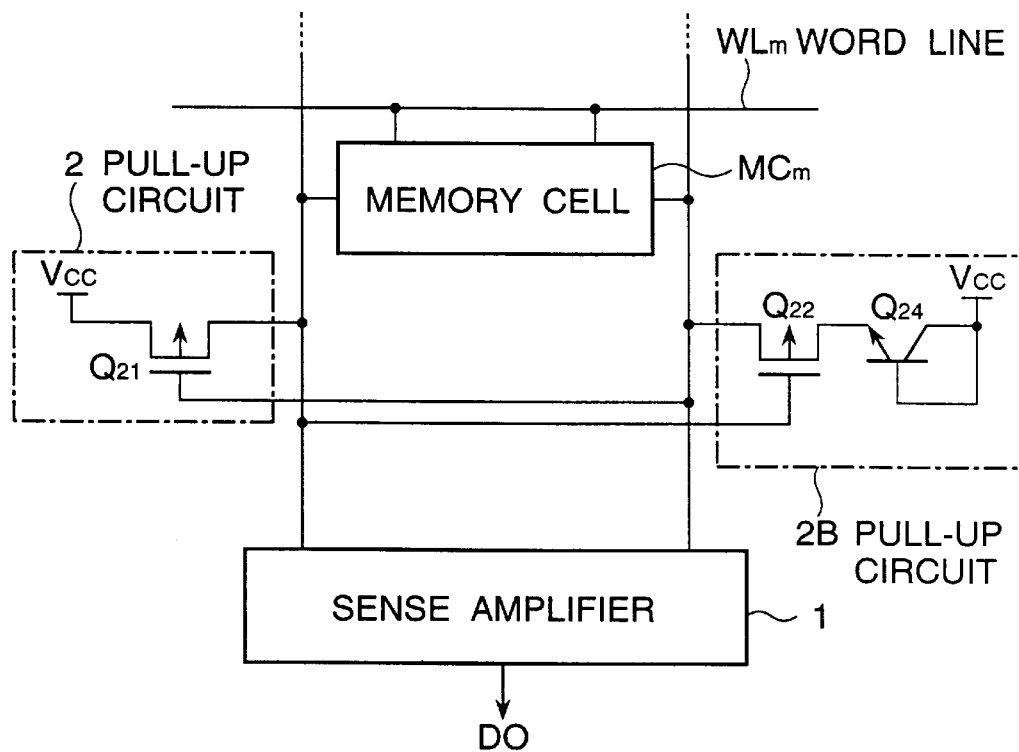
FIGS. 6 to 9 are partial circuit diagrams of various modifications of the embodiment of the semiconductor memory shown in FIG. 4.

In a first modification shown in FIG. 6, the pull-up circuit 2A is replaced with a pull-up circuit 2B in which the voltage drop element (which was formed of the p-channel transistor Q23 in the embodiment shown in FIG. 4) is formed of an NPN bipolar transistor Q24 having an emitter connected to the source of the transistor Q22 and a collector and a base connected in common to the high voltage supply potential Vcc so as to constitute a diode in function, similarly to the p-channel transistor Q23.

Figure 7:
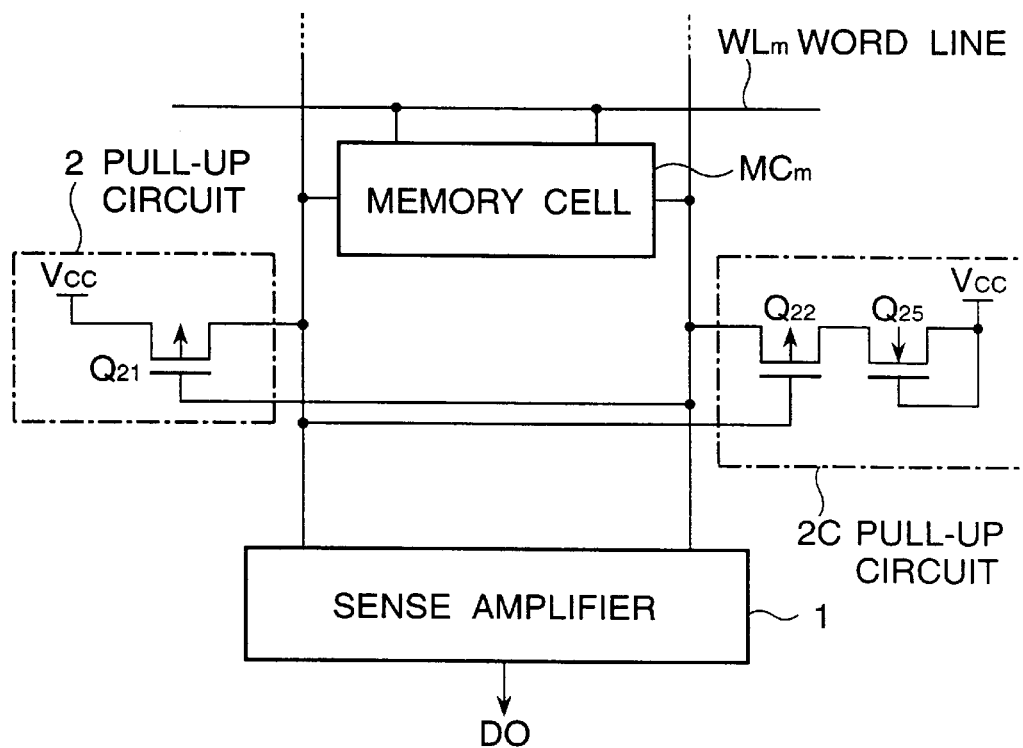

In a second modification shown in FIG. 7, the pull-up circuit 2A is replaced with a pull-up circuit 2C in which the voltage drop element (which was formed of the p-channel transistor Q23 in the embodiment shown in FIG. 4) is formed of an n-channel transistor Q25 having a source connected to the source of the transistor Q22 and a drain and a gate connected in common to the high voltage supply potential Vcc so as to constitute a diode in function, similarly to the p-channel transistor Q23.

In these modifications, advantages similar to those obtained in the embodiment shown in FIG. 4 can be obtained.

Figure 8:
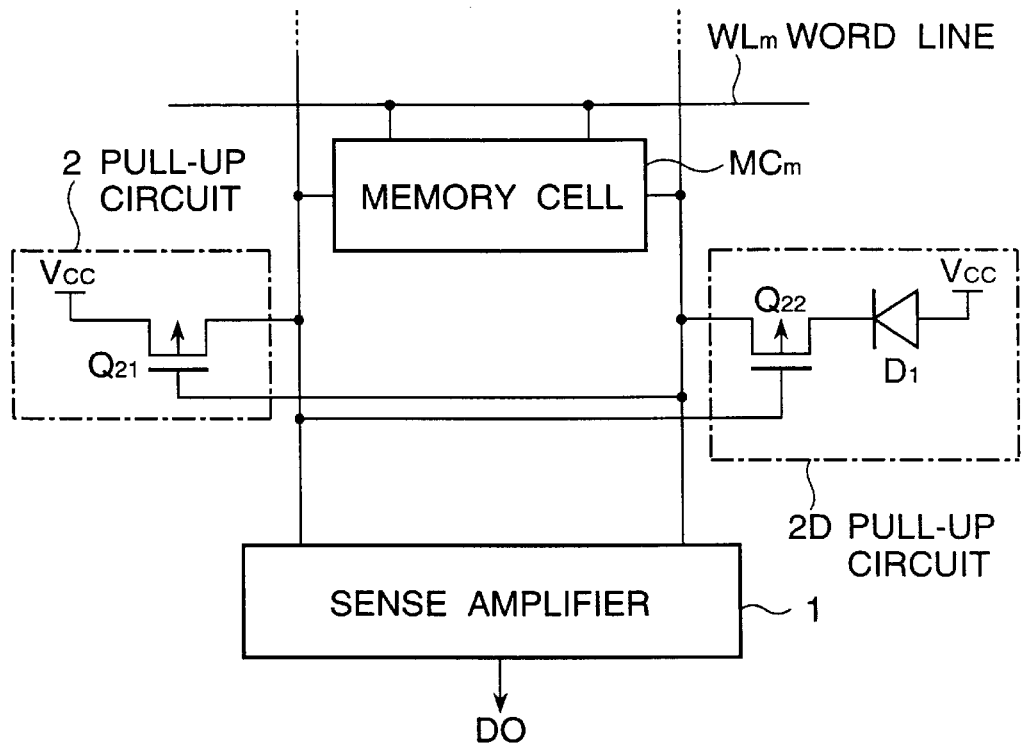

Furthermore, the voltage drop element (which was formed of the p-channel transistor Q23 in the embodiment shown in FIG. 4) is formed of simply a diode D1, which is connected at its anode to the high voltage supply potential Vcc and at its cathode of the source of the transistor Q22, as shown in FIG. 8.

Figure 9:
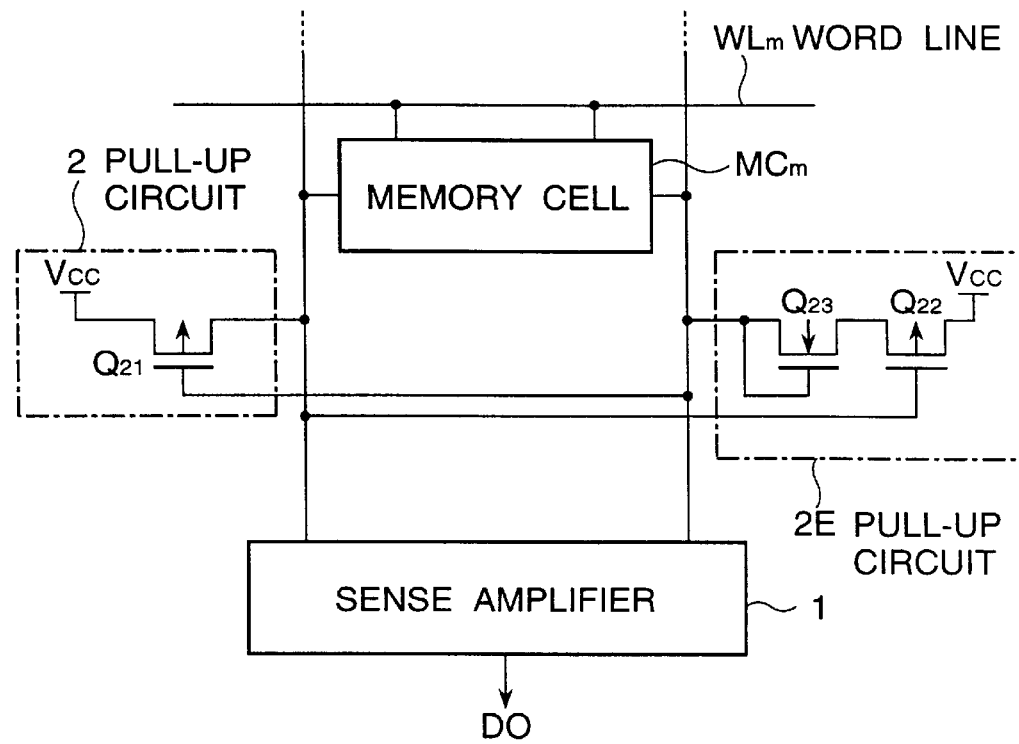

In addition, the transistor Q22 and the voltage drop element seriesconnected in the embodiments shown in FIGS. 4, 6, 7 and 8 can be exchanged by each other in position. For example, the embodiment of FIG. 4 can be modified to such a configuration that, as shown in FIG. 9, the drain and the gate of the p-channel transistor Q23 are connected in common to the bit line BL2, and the source of the p-channel transistor Q23 is connected to the drain of the p-channel transistor Q22, and further, the source of the p-channel transistor Q22 is connected to the high voltage supply potential Vcc.

In the above mentioned embodiments, if an absolute value of a p-channel transistor (not shown) which is included in the sense amplifier 1 and which has a gate connected to the bit line BL2, is smaller than the voltage drop amount of the voltage drop element (Q23, Q24, Q25, D1) in the pull-up circuits 2A to 2E, an extremely small on-current flows through the p-channel transistor in question. Therefore, it is desirable that the absolute value of the p-channel transistor (not shown) which is included in the sense amplifier 1 and which has the gate connected to the bit line BL2, is larger than the voltage drop amount of the voltage drop element (Q23, Q24, Q25, D1) in the pull-up circuits 2A to 2E.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory comprising:

at least one memory cell column including a plurality of flip-flop memory cells having driving n-channel transistors;

a plurality of word lines, each of said word lines being connected to a corresponding flip-flop memory cell of said plurality of flip-flop memory cells, said word lines for putting said corresponding flip-flop memory cell in a selected condition when said corresponding flip-flop memory cell is to be selected;

first and second complementary bit lines connected to said at least one memory cell column;

a sense amplifier, connected to said first and second bit lines, for sensing and amplifying a voltage difference between said first and second bit lines;

a first pull-up circuit, connected to said first bit line, for pulling up a potential of said first bit line to a first potential based on a potential of said second bit line in a reading operation; and a second pull-up circuit, connected to said second bit line, for pulling up, based on said potential of said first bit line, said potential of said second bit line to a second potential lower than said first potential by a predetermined potential difference in said reading operation.

2. A semiconductor memory comprising:

at least one memory cell column including a plurality of flip-flop memory cells having driving n-channel transistors;

a plurality of word lines, each of said word lines being connected to a corresponding flip-flop memory cell of said plurality of flip-flop memory cells, said word lines for putting said corresponding flip-flop memory cell in a selected condition when said corresponding flip-flop memory cell is to be selected;

first and second complementary bit lines connected to said at least one memory cell column;

a sense amplifier, connected to said first and second bit lines, for sensing and amplifying a voltage difference between said first and second bit lines;

a first pull-up circuit, connected to said first bit line, for pulling up a potential of said first bit line to a first potential based on a potential of said second bit line; and a second pull-up circuit, connected to said second bit line, for pulling up, based on said potential of said first bit line, said potential of said second bit line to a second potential lower than said first potential by a predetermined potential difference, wherein said first pull-up circuit includes a first p-channel transistor having a source connected to a first voltage, a drain connected to said first bit line, and a gate connected to said second bit line, and wherein said second pull-up circuit includes:

a second p-channel transistor having a drain connected to said second bit line, a gate connected to said first bit line and a source; and voltage dropping means, having a first end connected to said source of said second p-channel transistor and a second end connected to said first voltage, for supplying said source of said second p-channel transistor with a second voltage, said second voltage being lower than said first voltage by said predetermined potential difference.

3. A semiconductor memory as in claim 2, wherein said voltage dropping means comprises diode means.

4. A semiconductor memory as in claim 3, wherein said diode means comprises one of:

a diode having an anode connected to said first voltage and a cathode connected to said source of said second p-channel transistor;

a bipolar transistor connected between said source of said second p-channel transistor and said first voltage, and having a collector and a base connected to said collector; and a field effect transistor connected between said source of said second p-channel transistor and said first voltage, and having a drain and a gate connected to said drain.

5. A semiconductor memory comprising:

at least one memory cell column including a plurality of flip-flop memory cells having driving n-channel transistors;

a plurality of word lines, each of said word lines being connected to a corresponding flip-flop memory cell of said plurality of flip-flop memory cells, said word lines for putting said corresponding flip-flop memory cell in a selected condition when said corresponding flip-flop memory cell is to be selected;

first and second complementary bit lines connected to said at least one memory cell column;

a sense amplifier, connected to said first and second bit lines, for sensing and amplifying a voltage difference between said first and second bit lines;

a first pull-up circuit, connected to said first bit line, for pulling up a potential of said first bit line to a first potential based on a potential of said second bit line; and a second pull-up circuit, connected to said second bit line, for pulling up, based on said potential of said first bit line, said potential of said second bit line to a second potential lower than said first potential by a predetermined potential difference, wherein said first pull-up circuit includes a first p-channel transistor having a source connected to a first voltage, a drain connected to said first bit line, and a gate connected to said second bit line, and wherein said second pull-up circuit includes a second p-channel transistor and voltage dropping means connected in series between said second bit line and said first voltage, said second p-channel transistor having a gate connected to said first bit line.

6. A semiconductor memory as in claim 5, wherein said second p-channel transistor includes a drain connected to said second bit line and a source, and said voltage dropping means having a first end connected to said source of said second p-channel transistor and a second end connected to said first voltage, said voltage dropping means for supplying said source of said second p-channel transistor with a second voltage which is lower than said first voltage by said predetermined potential difference.

7. A semiconductor memory as in claim 5, wherein said second p-channel transistor includes a drain and a source, said voltage dropping means including a first end connected to said second bit line, and a second end connected to said drain of said second p-channel transistor, and wherein said source of said second p-channel transistor is connected to said first voltage, such that a second voltage, which is lower than said first voltage, by said predetermined potential difference, is supplied to said second bit line.

8. A semiconductor memory comprising;

at least one memory cell column including a plurality of flip-flop memory cells having driving n-channel transistors;

a plurality of word lines, each of said word lines being connected to a corresponding flip-flop memory cell of said plurality of flip-flop memory cells, said word lines for putting said corresponding flip-flop memory cell in a selected condition when said corresponding flip-flop memory cell is to be selected;

first and second complementary bit lines connected to said at least one memory cell column;

a sense amplifier, connected to said first and second bit lines, for sensing and amplifying a voltage difference between said first and second bit lines;

a first pull-up circuit connected to said first bit line, for pulling up a potential of said first bit line to a first potential based on a potential of said second bit line in a reading operation; and a second pull-up circuit, connected to said second bit line, for pulling up, based on said potential of said first bit line, said potential of said second bit line to a second potential lower than said first potential by a predetermined potential difference in said reading operation so that said first and second bit lines transmit a pair of complementary data signals, each of said data signals having a level, wherein said sense amplifier includes an output circuit for outputting an output signal corresponding to a change in said levels of said pair of complementary data signals from said first and second bit lines, said output circuit being configured to immediately respond to a transition from a high level to a low level of the data signal on said first bit line, but does not immediately respond to a transition from a high level to a low level of the data signal on the second bit line after the data signal on said first bit line has changed to the high level.

9. A semiconductor memory as in claim 8, wherein said output circuit of said sense amplifier includes;

a first two-input NAND gate having a first input connected to said first bit line, a second input and a first output; and a second two-input NAND gate having a third input connected to said second bit line, a fourth input connected to said first output of said first two-input NAND gate, and a second output connected to said second input of said first two-input NAND gate, said output circuit including a third output, said first output of said first two-input NAND gate comprising said third output of said output circuit.

10. A semiconductor memory as in claim 8, wherein said output circuit of said sense amplifier includes:

a first two-input NAND gate having a first input connected to said first bit line, a second input and a first output;

a second two-input NAND gate having a third input connected to said second bit line, a fourth input connected to said first output of said first two-input NAND gate, and a second output connected to said second input of said first two-input NAND gate; and an inverter having a fifth input connected to said first output of said first two-input NAND gate and a third output for outputting said output signal of said output circuit.

11. A semiconductor memory as in claim 8, wherein said first pull-up circuit includes a first p-channel transistor having a source connected to a high voltage supply potential, a drain connected to said first bit line, and a gate connected to said second bit line, and wherein said second pull-up circuit includes a second p-channel transistor having a drain connected to said second bit line, and a gate connected to said first bit line, and voltage dropping means having a first end connected to a source of said second p-channel transistor and a second end connected to said high voltage supply potential, for supplying said source of said second p-channel transistor with a voltage which is lower than said high voltage supply potential by said predetermined potential difference.

12. A semiconductor memory as in claim 11, wherein said voltage dropping means comprises diode means.

13. A semiconductor memory as in claim 12, wherein said diode means comprises one of a diode having an anode connected to said high voltage supply potential and a cathode connected to said source of said second p-channel transistor, a bipolar transistor connected between said source of said second p-channel transistor and said high voltage supply potential, and having a collector and a base connected to each other, and a field effect transistor connected between said source of said second p-channel transistor and said high voltage supply potential, and having a drain and a gate connected to each other.

14. A semiconductor memory as in claim 8, wherein said first pull-up circuit includes a first p-channel transistor having a source connected to a high voltage supply potential, a drain connected to said first bit line, and a gate connected to said second bit line, and wherein said second pull-up circuit includes a second p-channel transistor and voltage dropping means connected in series between said second bit line and said high voltage supply potential, a gate of said second p-channel transistor being connected to said first bit line.

15. A semiconductor memory as in claim 14, wherein a drain of said second p-channel transistor is connected to said second bit line, and wherein a first end of said voltage dropping means is connected to a source of said second p-channel transistor and a second end of said voltage dropping means is connected to said high voltage supply potential, for supplying said source of said second p-channel transistor with a voltage which is lower than said high voltage supply potential by said predetermined potential difference.

16. A semiconductor memory as in claim 14, wherein a first end of said voltage dropping means is connected to said second bit line, and a second end of said voltage dropping means is connected to a drain of said second p-channel transistor, and wherein a source of said second p-channel transistor is connected to said high voltage supply potential, so that a voltage, which is lower than said high voltage supply potential by said predetermined potential difference, is supplied to said second bit line.

* * * * *